United States Patent
Chen et al.

(10) Patent No.: US 9,177,758 B2
(45) Date of Patent: Nov. 3, 2015

(54) CHARGED PARTICLE BEAM APPARATUS

(71) Applicant: Hermes Microvision Inc., Hsinchu (TW)

(72) Inventors: Zhongwei Chen, San Jose, CA (US); Jack Jau, Los Altos, CA (US); Weiming Ren, San Jose, CA (US); Chiyan Kuan, Danville, CA (US); Yixiang Wang, Fremont, CA (US); Xiaoli Guo, Beijing (CN); Feng Cao, Beijing (CN)

(73) Assignee: HERMES MICROVISION INC., Hsinchu (TW)

( * ) Notice: Subject to any disclaimer, the term of this patent is extended or adjusted under 35 U.S.C. 154(b) by 0 days.

(21) Appl. No.: 14/564,921

(22) Filed: Dec. 9, 2014

(65) Prior Publication Data
US 2015/0144788 A1    May 28, 2015

Related U.S. Application Data

(63) Continuation-in-part of application No. 14/220,358, filed on Mar. 20, 2014.

(60) Provisional application No. 61/804,794, filed on Mar. 25, 2013.

(51) Int. Cl.
*H01J 37/26* (2006.01)
*H01J 37/28* (2006.01)
*H01J 37/22* (2006.01)

(52) U.S. Cl.
CPC .......... *H01J 37/261* (2013.01); *H01J 37/226* (2013.01); *H01J 37/28* (2013.01); *H01J 2237/063* (2013.01); *H01J 2237/10* (2013.01); *H01J 2237/24475* (2013.01); *H01J 2237/2801* (2013.01); *H01J 2237/2806* (2013.01)

(58) Field of Classification Search
USPC .......... 250/306, 307, 310, 311, 396 ML, 397
See application file for complete search history.

(56) References Cited

U.S. PATENT DOCUMENTS

| | | | | |
|---|---|---|---|---|
| 4,068,123 | A * | 1/1978 | Kokubo | 250/311 |
| 5,408,098 | A * | 4/1995 | Wells | 250/310 |
| 6,392,231 | B1 | 5/2002 | Chen | |
| 6,627,896 | B1 * | 9/2003 | Hashimoto et al. | 250/370.11 |
| 6,730,907 | B1 | 5/2004 | Feuerbaum et al. | |
| 8,791,425 | B2 * | 7/2014 | Ren et al. | 250/396 ML |
| 2009/0230304 | A1 * | 9/2009 | Hatano et al. | 250/311 |
| 2009/0242792 | A1 * | 10/2009 | Hosoya et al. | 250/397 |
| 2010/0012838 | A1 * | 1/2010 | Hatakeyama et al. | 250/307 |
| 2013/0037715 | A1 * | 2/2013 | Boughorbel et al. | 250/307 |
| 2014/0291510 | A1 * | 10/2014 | Chen et al. | 250/307 |
| 2014/0353498 | A1 * | 12/2014 | Shur | 250/307 |
| 2015/0083912 | A1 * | 3/2015 | Chen et al. | 250/310 |
| 2015/0155133 | A1 * | 6/2015 | Chen et al. | 250/310 |

* cited by examiner

*Primary Examiner* — Bernard E Souw
(74) *Attorney, Agent, or Firm* — WPAT, PC; Justin King

(57) ABSTRACT

The present invention provides a dual-beam apparatus which employs the dark-field e-beam inspection method to inspect small particles on a surface of a sample such as wafer and mask with high throughput. The dual beam apparatus comprises two single-beam dark-field units placed in a same vacuum chamber and in two different orientations. The two single-beam dark-field units can perform the particle inspection separately or almost simultaneously by means of the alternately-scanning way. The invention also proposes a triple-beam apparatus for both inspecting and reviewing particles on a sample surface within the same vacuum chamber. The triple-beam apparatus comprises one foregoing dual-beam apparatus performing the particle inspection and one high-resolution SEM performing the particle review.

23 Claims, 11 Drawing Sheets

CHARGED PARTICLE BEAM APPARATUS

CROSS REFERENCE TO RELATED APPLICATIONS

This application is a Continuation-in-Part application and claims priority to U.S. application Ser. No. 14/220,358 filed Mar. 20, 2014, which claims the benefit of priority to U.S. Provisional application No. 61/804,794 entitled to Zhongwei Chen et al. filed Mar. 25, 2013 and entitled "Charged Particle Beam Apparatus", the entire disclosures of which are incorporated herein by reference.

BACKGROUND OF THE INVENTION

1. Field of the Invention

The present invention relates to a charged particle beam apparatus which employs a scanning electron microscope (SEM) to inspect or observe particles and/or defects on a sample surface. More particularly, it relates to a low-voltage scanning electron microscope (LVSEM) for inspecting uninvited particles and/or defects on surfaces of patterned wafers or masks in semiconductor manufacturing industry.

2. Description of the Prior Art

In semiconductor manufacturing industry, uninvited particles sometime appear and remain on surfaces of masks and/or wafers during semiconductor fabrication process for some reasons, and they impact yield to a great degree. To monitor and therefore ensure the yield, optical apparatuses or called optical tools which are typically based on microscopy have been employed to inspect the particles after some fabrication processes because of their high inspection throughputs and good detection efficiencies. As integrations of IC chips are required higher and higher, critical dimensions of patterns on wafers and masks are shrunk, and consequently smaller and smaller particles will become killers in the yield. On development trends, optical tools are losing their abilities to detect such killer particles due to their longer wavelengths compared to particle dimensions.

Theoretically, an electron beam (e-beam) has a relatively shorter wavelength (such as 0.027 nm/2 keV) compared to particle dimensions (down to several nm), and therefore can provide higher detection sensitivity for small particles than an optical beam. Higher detection efficiency comes from higher detection sensitivity. Conventional e-beam apparatuses or called e-beam tools for inspecting defects on wafer/mask, which are based on Low-voltage Scanning Electron Microscopy (LVSEM) with the normal incidence, can therefore directly perform particle inspection but still be criticized in detection sensitivity and throughput.

To get a high detection sensitivity and high inspection throughput in particle inspection, a dark-field e-beam inspection method is proposed in the cross reference. The dark-field e-beam method employs the difference between the irregular scattering on particles and regular scattering on a sample surface due to an illumination of a primary electron (PE) beam. A dark-field backscattered electron (BSE) imaging, which has a high contrast due to the particles, can be obtained by specifically arranging oblique illumination of the PE beam, collection of backscattered electrons (BSEs) and guiding secondary electrons (SEs). FIGS. 1A and 1B schematically illustrate the formation of the dark-field BSE image. In FIG. 1A, a primary electron (PE) beam 1 passes through a hole of an electron detector 3 and illuminates a sample 2 by an oblique incidence. Consequently, BSEs and SEs are generated and emitted from the illuminated area. Most of the BSEs due to the sample surface travel to the reflection side, and most of the BSEs generated due to the particle 21 moves towards the incidence side and are collected by the detector 3. The electrode 4 attracts the SEs 12 to prevent them from being collected by the detector 3. In other words, the detector 3 only detects the dark-field BSEs 11 which comprise a minority of the diffusely scattered BSEs from the sample surface and most of both the diffusely scattered BSEs and the reflection-like scattered BSEs from the particle 21. In FIG. 1B, the detection signal S3 of the detector 3 is increasing from a low value S3_0 to a high value S3_1, as the PE beam 1 approaches the position P1 of the particle 21. The particle 21 will be shown in the scanning image with a dark background and a high contrast and therefore can be detected out easily.

For a sample with surface trenches or called patterned sample, an e-beam apparatus, which comprises only one single-beam unit employing the foregoing dark-field e-beam inspection method (simply expressed as single-beam dark-field unit hereafter), is only adequate to detect particles inside trenches which are orientated almost parallel to the incidence plane (formed with the surface normal) of the PE beam 1. For the sample 2 in FIG. 2, one single-beam dark-field unit with an oblique incidence in XOZ plane can detect the particle 21-2 inside the trench 22-2 along the X direction, not the particle 21-1 inside the trench 22-1 along the Y direction, as shown in FIGS. 3A~3C. As the trench 22-1 lowers the particle 21-1 almost below the surface of the sample 2 in FIG. 3A, the PE beam 1 can only hit the top of the particle 21-1 and consequently the dark-field BSEs 11 disappear. In FIG. 3B, the trench 22-1 is so deep that the PE beam 1 can not hit the particle 21-1 at all. In FIG. 3C, although the trench 22-2 is so deep that the particle 21-2 is much lower than the surface of the sample 2, the PE beam 1 can travel along the trench 22-2 and hit the particle 21-2 from bottom to top as usual.

Accordingly, an e-beam apparatus, which can especially inspect small particles on a patterned sample surface with high detection efficiency and high throughput, is needed. In addition, it will benefit the yield management in semiconductor manufacturing to a great degree if the e-beam apparatus can observe or review the detected particles within the same vacuum chamber as well.

SUMMARY OF THE INVENTION

One object of this invention is to provide an e-beam apparatus to inspect particles on a patterned sample surface by the dark-field e-beam inspection method proposed by Chen et al. in the cross reference. Accordingly, this invention proposes a dual-beam apparatus, which comprises two single-beam units employing the foregoing dark-field e-beam inspection method in different directions; i.e. two single-beam dark-field units inspect the patterned sample in two different orientations. The two single-beam dark-field units can perform the inspections separately or almost simultaneously by means of alternately-scanning.

Another object of this invention is to further provide an e-beam apparatus which can perform functions of inspecting and reviewing particles on a patterned sample surface within the same vacuum chamber by using the foregoing dark-field e-beam inspection method and a high-resolution SEM. Accordingly, this invention proposes a triple-beam apparatus, which comprises one foregoing dual-beam apparatus for the particle inspection and one conventional high-resolution SEM for the particle review. The triple-beam apparatus can perform the particle inspection and the particle review within a common vacuum chamber, thereby removing many procedures for sample transfer. Hence, this invention will especially benefit the yield management in semiconductor manufacturing.

Accordingly, the invention provides a method for inspecting particles on a patterned surface of a sample. The method comprises steps of providing two single-beam units respectively having a primary electron beam, orientating two primary electron beams of the two single-beam units in two different directions, and using the two single-beam units to generate dark-field BSE images of the patterned surface. Each of the two single-beam units comprises the primary electron (PE) beam, a detector with a through hole for the PE beam passing through, and an electrode close to the patterned surface. The PE beam obliquely illuminates and scans the patterned surface and thereby generating backscattered electrons and secondary electrons therefrom. The detector detects the backscattered electrons traveling towards an incidence side of the PE beam. The electrode attracts the secondary electrons from hitting the detector so that the detector provides a dark-field BSE image of the patterned surface. The PE beams of the two single-beam units are preferred substantially perpendicular to each other.

The invention also provides a multi-beam apparatus for observing a patterned surface of a sample, which comprises a sample stage supporting the sample, a first single-beam unit and a second single-beam unit both units above an observing plane. The patterned surface is placed upwards and coincides with the observing plane. The optical axes of the first and second single-beam units are orientated in two different directions. Each of the first and second single-beam units comprises an electron source emitting inspection primary electrons along the optical axis thereof, a gun aperture plate below the electron source and having at least one upper opening, a condenser lens below the gun aperture plate and aligned with the optical axis, a beam-limit aperture plate below the condenser lens and having at least one lower opening, a magnetic objective lens below the beam-limit aperture plate and aligned with the optical axis, a scanning deflection device inside a bore of the magnetic objective lens, an electron detector below the magnetic objective lens and having a through hole, and an attraction electrode beside the electron detector and above the observing plane.

For each of the first and second single-beam units, the inspection primary electrons form an inspection primary electron beam (PE beam), one of the upper openings of the gun aperture plate is aligned with the optical axis and limits a current of the inspection PE beam to a first current value, and one of the lower openings of the beam-limit aperture plate is aligned with the optical axis and limits the current of the inspection PE beam to a second current value. The through hole is aligned with the optical axis so that the inspection PE beam can pass through. An incidence angle formed between the optical axis and a normal of said observing plane is larger than 0°. Both the condenser lens and the magnetic objective lens together focus the inspection PE beam onto the patterned surface. An electron detection area of the electron detector aslant faces the observing plane so as to be able to collect backscattered electrons which are generated from the patterned surface by the inspection PE beam and travel towards an incidence side thereof (called as Dark-field BSEs). The attraction electrode attracts secondary electrons generated from the patterned surface by the inspection PE beam (called as SEs) to prevent the SEs from hitting the electron detection area of the electron detector. The scanning deflection device deflects the inspection PE beam so as to scan the patterned surface, thereby obtaining a dark-field BSE image thereof by the electron detector.

In a preferred embodiment, this invention may further comprise a third single-beam unit to review the patterned surface. The third single-beam unit may comprise a third electron source emitting review primary electrons along a third optical axis, a third gun aperture plate below the third electron source and having at least a third upper opening, a third condenser lens below the third gun aperture plate and aligned with the third optical axis, a third beam-limit aperture plate below the third condenser lens and having at least a third lower opening, a third magnetic objective lens below the third beam-limit aperture plate and aligned with the third optical axis, a third scanning deflection device inside a third bore of the third magnetic objective lens, and a third electron detector between the third beam-limit aperture plate and the third magnetic objective lens. The third optical axis is an optical axis of the third single-beam unit and the review primary electrons form a review primary electron beam (PE beam) thereof. One of the third upper openings of the third gun aperture plate is aligned with the third optical axis and limits a current of the review PE beam to a third current value, and one of the third lower openings of the third beam-limit aperture plate is aligned with the third optical axis and limits the current of the review PE beam to a fourth current value. The third electron detector has a third through hole aligned with the third optical axis for the review PE beam passing through. The third optical axis is substantially perpendicular to the observing plane. Both the third condenser lens and the third magnetic objective lens together focus the review PE beam onto the patterned surface. An electron detection area of the third electron detector faces the observing plane so as to be able to collect secondary electrons and/or backscattered electrons generated from the patterned surface by the review PE beam and traveling upwards. The third scanning deflection device deflects the review PE beam so as to scan the patterned surface, thereby obtaining a SE and/or BSE image thereof by the third electron detector.

In a preferred embodiment, the optical axes of the first and second single-beam units may be substantially perpendicular to each other. A distance between intersections formed by the optical axes of the first and second single-beam units on the observing plane is so large that the first and second single-beam units can work independently. In one case, each of first and second single-beam units may scan the inspection PE beam thereof over the patterned surface in two directions perpendicular to each other while the sample is remaining at rest. In another case, each of first and second single-beam units may scan the inspection PE beam thereof over the patterned surface in a first direction while the sample is moving in a second direction substantially perpendicular to the first direction.

In another preferred embodiment, intersections formed by the optical axes of the two single-beam units on the observing plane are close to each other. The attraction electrodes of the first and second single-beam units can be combined into one electrode. For the first and second single-beam units, one scans the inspection PE beam thereof over one interested inspection area of the patterned surface while the other blanks out the inspection PE beam thereof.

In this preferred embodiment, the first and second single-beam units may obtain dark-field BSE images of the interested inspection area one after the other. In one case, each of the first and second single-beam units scans the interested inspection area in two directions perpendicular to each other while the sample is remaining at rest. In another case, each of first and second single-beam units may scan the inspection PE beam thereof over the interested inspection area in a first direction while the sample is moving in a second direction substantially perpendicular to the first direction.

In this preferred embodiment, the first and second single-beam units can also work synchronously. Each of the first and second single-beam units has a control clock signal for scanning imaging, which comprises multiple line-scanning periods and beam-retracing periods alternately distributing. For each of the first and second single-beam units, during one line-scanning period, the inspection PE beam linearly scans the interested inspection area to obtain one line of a scanning image thereof, and during one beam-retracing period, the inspection PE beam goes to a place corresponding to a starting point of a line of said scanning image. The control clock signals of the first and second single-beam units are synchronized with a phase difference. A line-scanning period in one of the first and second single-beam units corresponds to a beam-retracing period in the other of the first and second single-beam units, and each of the first and second single-beam units blanks out the inspection PE beam thereof during the beam-retracing period thereof. In a case, each of the first and second single-beam units may scan the interested inspection area in two directions perpendicular to each other while the sample is remaining at rest. In another case, the first and second units scan the inspection PE beams thereof over the interested inspection area in a first direction and a second direction respectively while the sample moves in a direction different from the first and second directions.

Other advantages of the present invention will become apparent from the following description taken in conjunction with the accompanying drawings wherein are set forth, by way of illustration and example, certain embodiments of the present invention.

BRIEF DESCRIPTION OF THE DRAWINGS

The present invention will be readily understood by the following detailed description in conjunction with the accompanying drawings, wherein the same or like reference numerals designate the same or like structural elements, and in which.

DETAILED DESCRIPTION OF EXAMPLE EMBODIMENTS

Figure 1A:
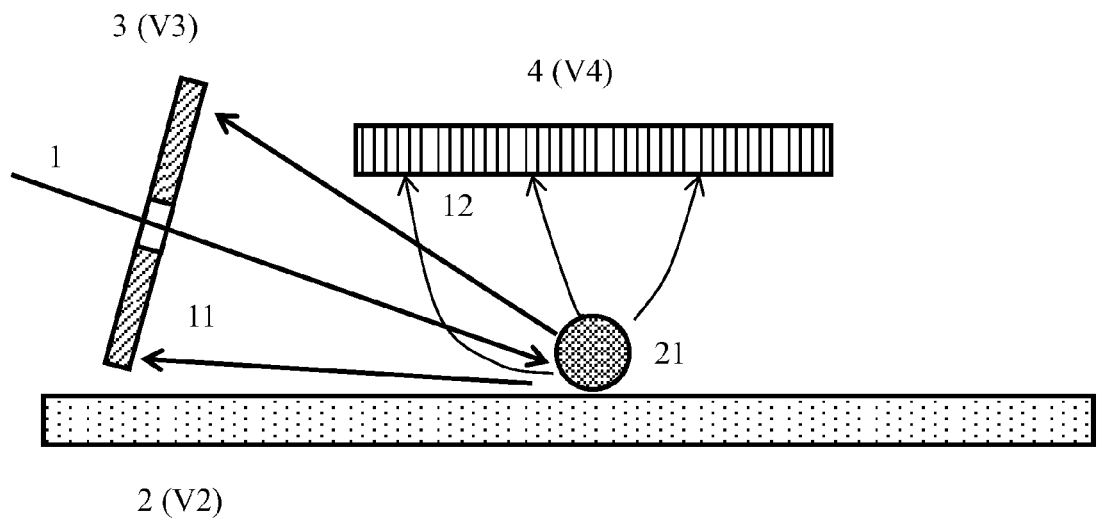
FIGS. 1A and 1B are schematic illustrations of the formation of a dark-field BSE image for inspecting a particle on a sample surface (Prior Art).

Various example embodiments of the present invention will now be described more fully with reference to the accompanying drawings in which some example embodiments of the invention are shown. Without limiting the scope of the protection of the present invention, all the description and drawings of the embodiments will exemplarily be referred to an electron beam. However, the embodiments are not be used to limit the present invention to specific charged particles.

In the drawings, relative dimensions of each component and among every component may be exaggerated for clarity. Within the following description of the drawings the same or like reference numbers refer to the same or like components or entities, and only the differences with respect to the individual embodiments are described.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention.

In this invention, particle means any kind of uninvited protrusions, such as residues not etched in an etching process or particles dropped in any semiconductor process.

In this invention, X, Y and Z axes form Cartesian coordinate, and a being-inspected surface of a sample surface is located on XOY plane.

In this invention, "axial" means "in the optical axis direction of an apparatus, unit, column or a lens", while "radial" means "in a direction perpendicular to the optical axis".

In this invention, the orientation of an apparatus, unit, column or a lens is the optical axis orientation thereof.

In this invention, a single-beam unit comprises an electron source providing a single PE beam along an optical axis and a column focusing the PE beam onto a sample surface, and what the PE beam is blanked out means the PE beam can not illuminate onto the sample surface. The PE beam blanking can be done by a beam blanker inside the single-beam unit and located at any possible place above the sample surface.

As it is well known that when a PE beam impinges on a sample, SEs (energy 50 eV) and BSEs (50 eV≤energy PE landing energy) will be generated and emitted from the sample surface. For SE emission, on the one hand, the angular distribution conforms Lambert's law (proportional to cos $\phi$, where $\phi$ is emission angle relative to the surface normal), irrespective of energy and incidence angle α (relative to the surface normal) of PE beam and sample material. On the other hand, the SE yield δ increases with increasing incidence angle, and this characteristic provides possibility to image topography of the sample surface.

For BSE emission, the BSE coefficient η increases with increasing incidence angle α and/or atomic number, and this enables the imaging of both topography and material contrast of the sample surface. The angular distribution depends on the energy and the incidence angle α of the PE beam and the sample material, which generally consists of two parts, a diffusely scattered part with Lambert' distribution and a reflection-like part with emission maximum. Inside the tilt range α=0°~60°, the diffusely scattered part remains approximately constant, which is an advantage for observation of material contrast. The reflection-like part is getting obvious with increasing incidence angle, and more obvious within the tilt range α≥60°.

Figure 1B:
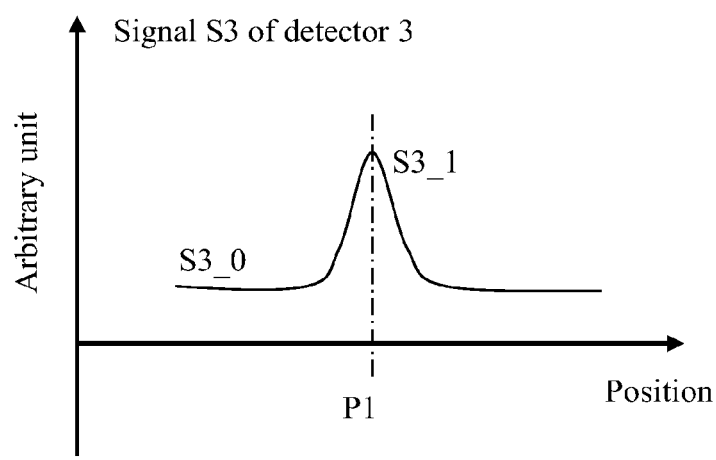
Figure 2:
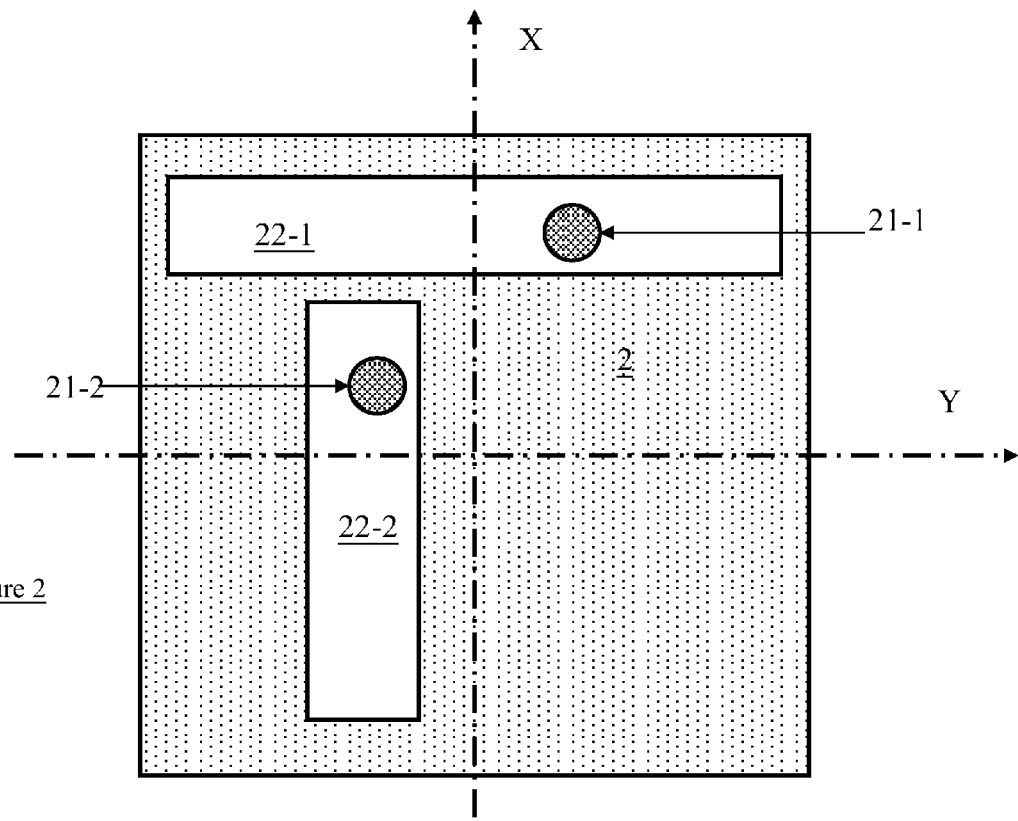
FIG. 2 shows a patterned sample surface with trenches and particles therein.
Figure 3A:
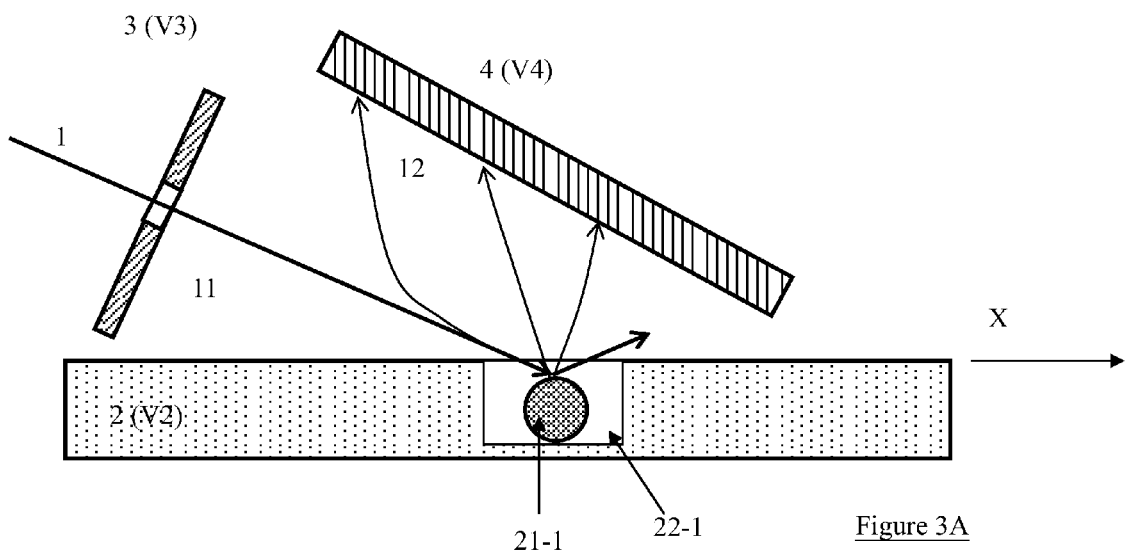
FIGS. 3A~3C schematically illustration how the trenches on the sample surface in FIG. 2 influence the formation of the dark-field BSE image with respect to the particles.
Figure 3B:
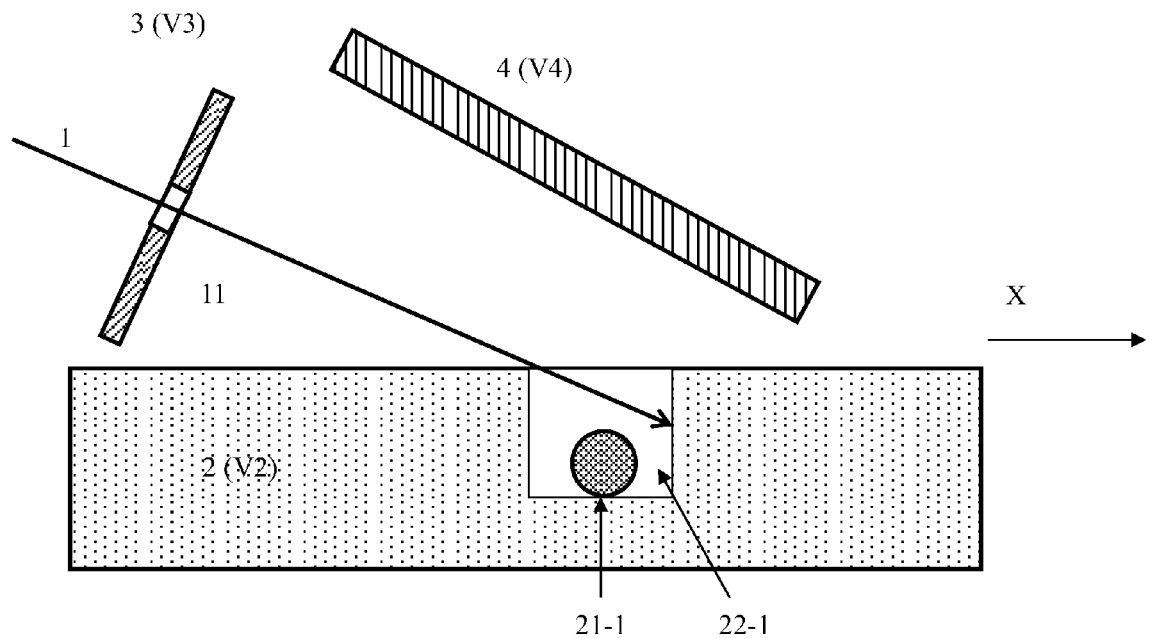
Figure 3C:
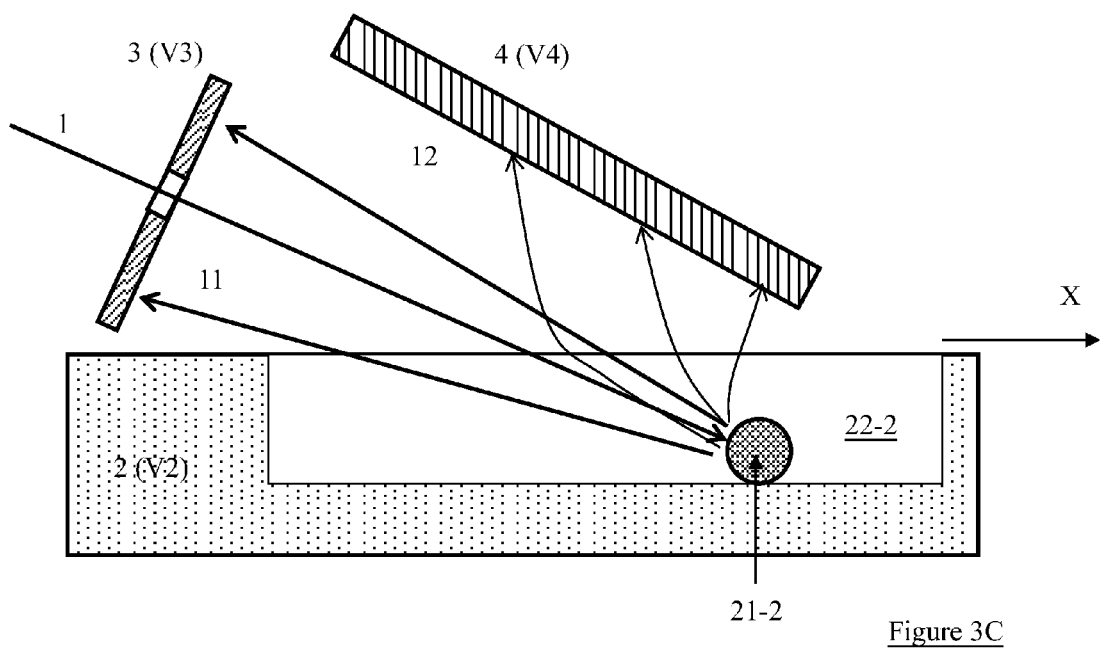

If there is a particle on a sample surface, the values of incidence angle of a PE beam, when respectively hitting the sample surface and the particle, will be different due to the different normal directions thereof. This difference provides possibilities for detecting the particle by material contrast and topography contrast. It is well known that high contrast of a detection signal results in high detection sensitivity for the particle. To get high contrast, it is advantage to reduce the background component (due to the collection of the electrons emitted from the sample surface) and/or increase the feature component (due to the collection of the electrons emitted from the particle). In terms of the foregoing characteristics, in the cross reference Chen et al. propose the dark-field e-beam inspection method for detecting particles on a sample surface by dark-field BSE imaging, as shown in FIGS. 1A and 1B. Based on this method, Chen et al. further provide several embodiments of the single-beam dark-field unit for particle inspection, such as the embodiment in FIG. 8.

For a patterned sample such as a patterned wafer, there are trenches on its surface and the trenches generally are not in a same orientation. As shown in FIG. 2 and FIGS. 3A~3C and explained in DESCRIPTION OF THE PRIOR ART, one single-beam dark-field unit is only adequate to detect particles inside those trenches parallel to the incidence plane of its PE beam. In other words, an orientation matching between trench (on the sample) and incidence plane (of the single-beam dark-field unit) has to be established before executing the particle inspection. Accordingly, an inspected area of a patterned sample usually has to be rotated a specific value (such as 90° for detecting the particle 21-1 in the trench 22-1 in FIG. 3A or FIG. 3B) and then inspected again after being inspected first time. The orientation matching between trench and incidence plane has to be done by both a rotational motion and a translational motion of the patterned sample. For inspecting a patterned wafer, which is usually 300 mm in diameter and have trenches parallel and/or perpendicular to each other, the wafer stage is designed to only provide translational motion for the simplicity in mechanical structure. In this case, the patterned wafer has to be moved from the wafer stage to the wafer handler and is rotated by the wafer handler. Further, the wafer is transferred between vacuum environment of wafer stage to atmosphere environment of wafer handler, and a time-consuming procedure in load/lock is processed. Therefore, multiple transfers between the wafer stage and wafer handler have to be done so as to fully inspect the inspected area on the patterned wafer. The multiple transfers reduce the inspection throughput to a large degree.

To solve the foregoing throughput issue, this invention proposes a dual-beam apparatus comprising two single-beam dark-field units with different orientations. The two single-beam dark-field units are oriented to provide orientation matching between trench (on the sample) and incidence plane in two different directions, therefore a rotation motion is not necessary for the inspections in the two orientations. The orientation difference between the two single-beam dark-field units can be simply expressed by the parallax β, which is the angle between the orientations thereof. The value of the parallax β can be determined in terms of the trench orientations of a being-inspected sample, and the 90° parallax or a substantial 90° parallax will meet the requirements of most applications. For example, the 90° parallax is best for inspecting a patterned wafer. The two single-beam dark-field units can perform the particle inspection separately or almost simultaneously.

Figure 4A:
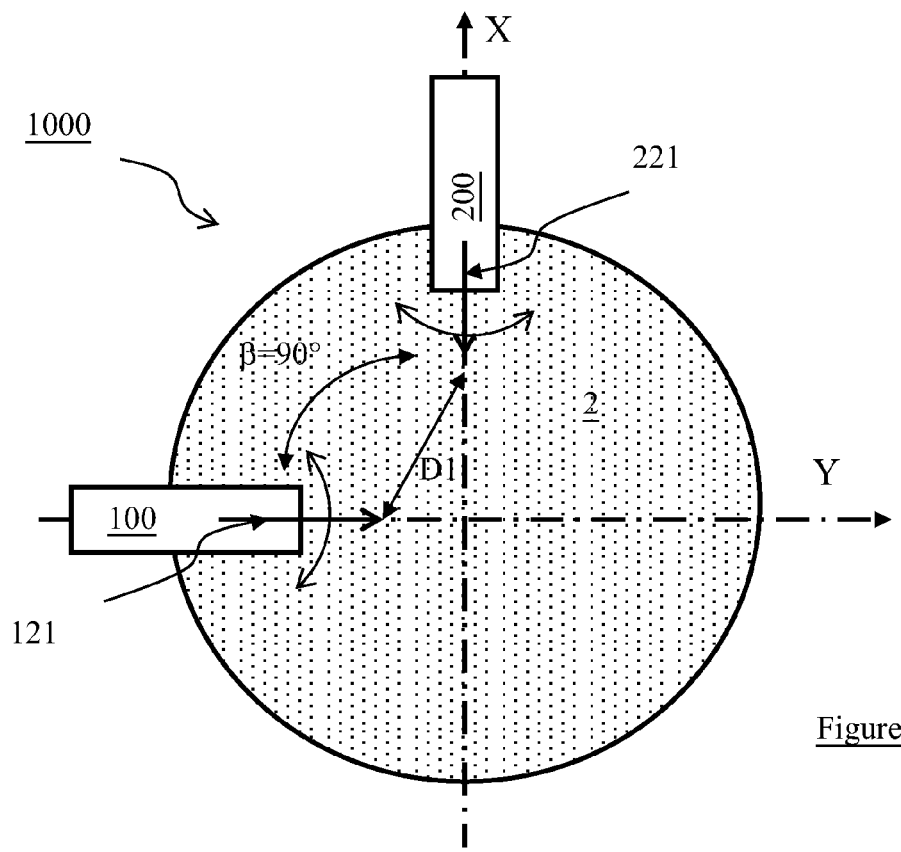
FIGS. 4A~4C are schematic illustrations of a configuration of a dual-beam apparatus for inspecting particles on a sample surface in accordance with one embodiment of the present invention.
Figure 4B:
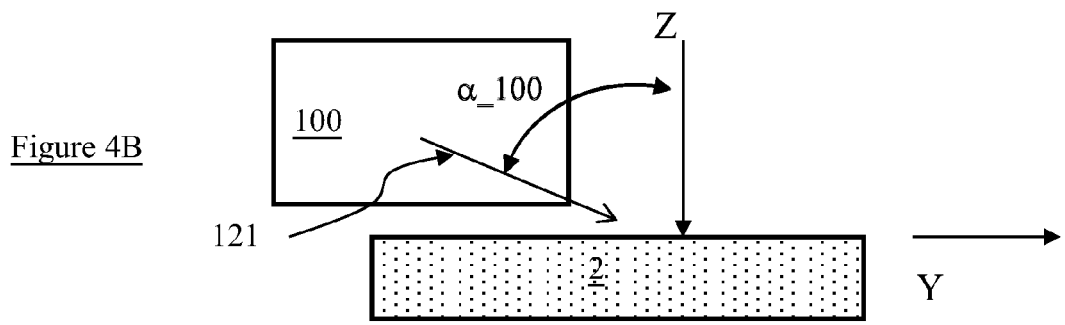
Figure 4C:
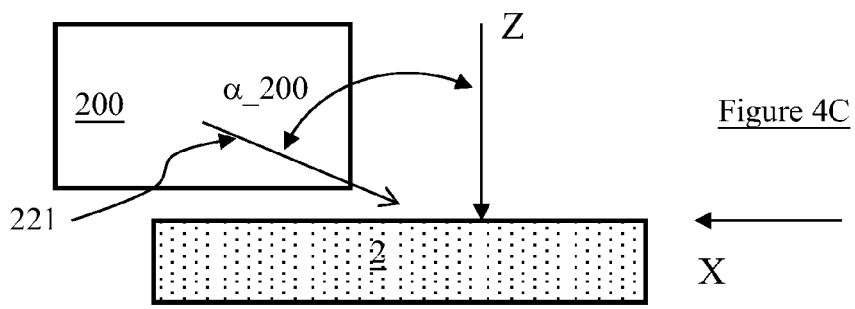

One embodiment 1000 of the dual-beam apparatus is shown in FIGS. 4A~4C. In FIG. 4A, the optical axes of two single-beam dark-field units 100 and 200 are respectively located inside YOZ plane and XOZ plane, and thereby forming the 90° parallax and the translation D1 on the observing plane located on the XOY plane. A being-inspected surface of the sample 2 is located on the XOY plane. Two single-beam dark-field units 100 and 200 respectively form incidence angles $\alpha\_100$ and $\alpha\_200$ on the being-inspected surface, as shown in FIGS. 4B and 4C. The translation D1 is so large that two single-beam dark-field units 100 and 200 do not interfere with each other and therefore can work independently. For the two single-beam dark-field units 100 and 200, their fields of view (FOV) do not overlap and the PE beam in one of them will not influence the imaging signal of the other of them. In other words, one of the two single-beam dark-field units 100 and 200 is not necessary to blank out its PE beam when the other is doing inspection. For a being-inspected area on the being-inspected surface, it can be orientated and moved to be inspected by the single-beam dark-field units 100 at first, then is displaced the distance D1 to be inspected by the single-beam dark-field unit 200. In addition, the two single-beam dark-field units 100 and 200 can also inspect two being-inspection areas simultaneously.

The single-beam dark-field units 100 and 200 in the embodiment 1000 can obtain the images of the sample 2 in the scanning-while-at-rest method or the scanning-while-moving method. For the scanning-while-at-rest method, each of the single-beam dark-field units 100 and 200 scans one being-inspected area in both X and Y directions while the sample is remaining at rest. In this case, a defocus will occur over a field of view (FOV) due to an axial displacement of each PE beam landing position. The PE beam 121 lands on the sample 2 with an axial displacement $\Delta L = \Delta y \cdot \sin(\alpha\_100)$ when scanning in the Y direction, while the PE beam 221 lands on the sample 2 with an axial displacement $\Delta L = \Delta x \cdot \sin(\alpha\_200)$ when scanning in the X direction. The defocus becomes obvious for a large incidence angle and a large FOV. The defocus can be eliminated by auto-focusing, i.e. automatically adjusting one of focusing lenses inside each single-beam dark-field unit. The defocus can be dramatically reduced or even eliminated when using the scanning-while-moving method, as shown in FIGS. 5A and 5B and FIGS. 6A and 6B.

Figure 5A:
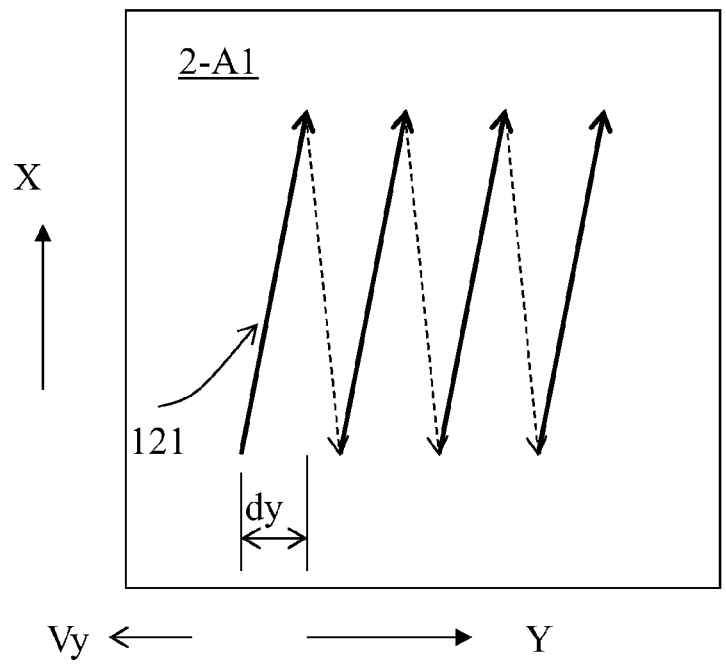
FIGS. 5A and 5B are schematic illustrations of a scanning method of the dual-beam apparatus shown in FIGS. 4A~4C in accordance with another embodiment of the present invention.
Figure 5B:
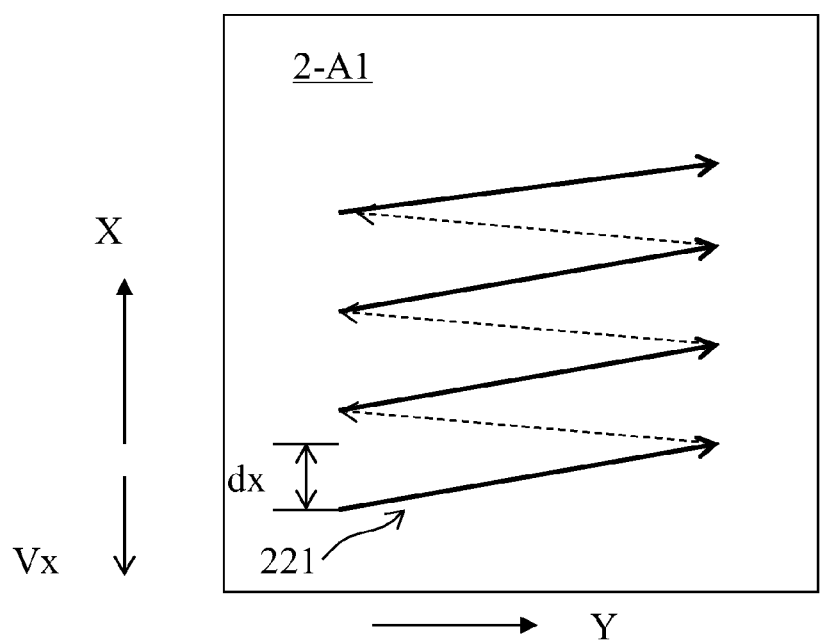

For the scanning-while-moving method, one of the single-beam dark-field units 100 and 200 scans one being-inspected area in one direction while moving the sample in another direction. In FIG. 5A, the PE beams 121 of the single-beam dark-field units 100 scans the being-inspected area 2-A1 in the X direction while the sample is moving at the speed Vy in the −Y direction. In FIG. 5B, the PE beams 221 of the single-beam dark-field units 200 scans the being-inspected area 2-A1 in the Y direction while the sample is moving at the speed Vx in the −X direction. In both FIGS. 5A and 5B, there are no defocus due to the PE beams 121 and 221 have no axial displacements respectively.

Figure 6A:
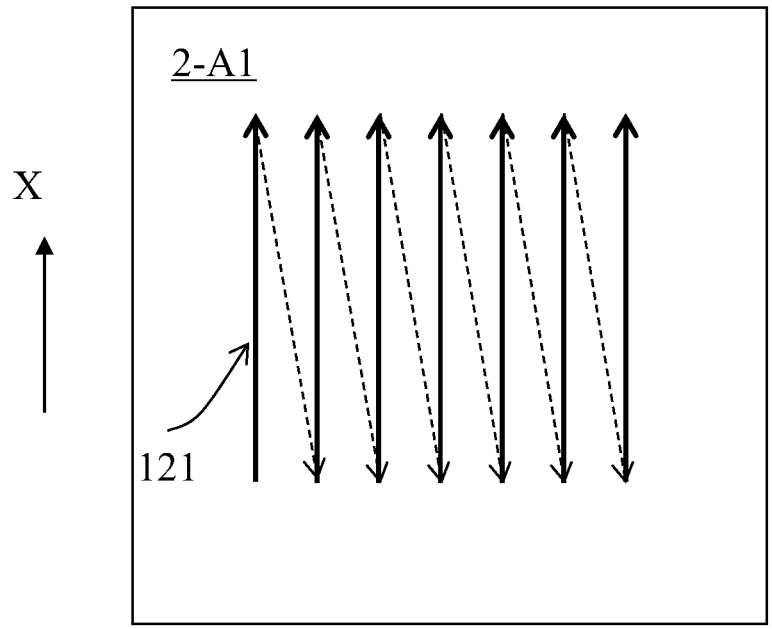
FIGS. 6A and 6B are schematic illustrations of another scanning method of the dual-beam apparatus shown in FIGS. 4A~4C in accordance with another embodiment of the present invention.
Figure 6B:
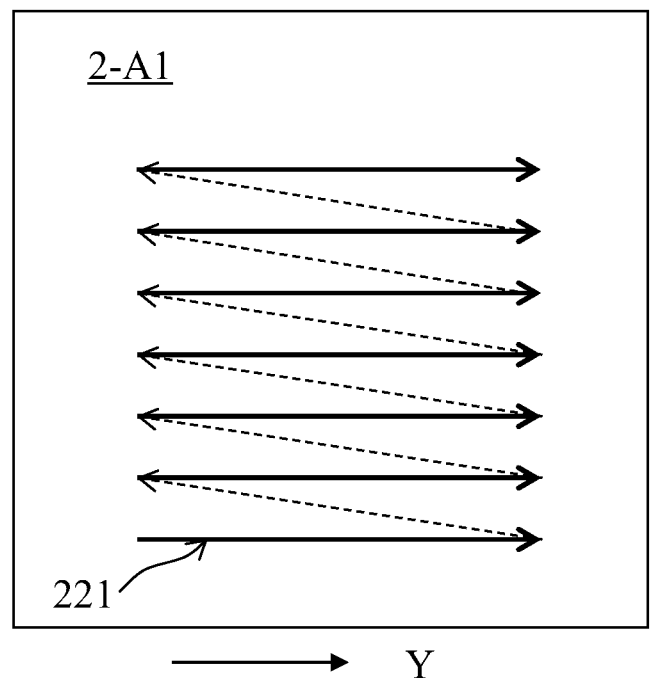

In FIGS. 5A and 5B, each scanning line has a shift in the sample moving direction, such as dx and dy. The scanning line shift can be eliminated by slightly turning the scanning direction towards the sample moving direction, such as the ways shown in FIGS. 6A and 6B. In FIG. 6A, the PE beams 121 of the single-beam dark-field unit 100 scans the being-inspected area 2-A1 with a high speed in the X direction and a low speed in the −Y direction which follows the sample movement in the −Y direction. In FIG. 6B, the PE beams 221 of the single-beam dark-field unit 200 scans the being-inspected area 2-A1 with a high speed in the Y direction and a low speed in the −X direction which follows the sample movement in the −X direction. In FIGS. 6A and 6B, the PE beams 121 and 221 slightly shift 1 pixel (equal to several nm to tens nm) in the Y direction and the X direction respectively, and therefore the defocus in each of the single-beam dark-field units 100 and 200 will be negligible.

Figure 7:
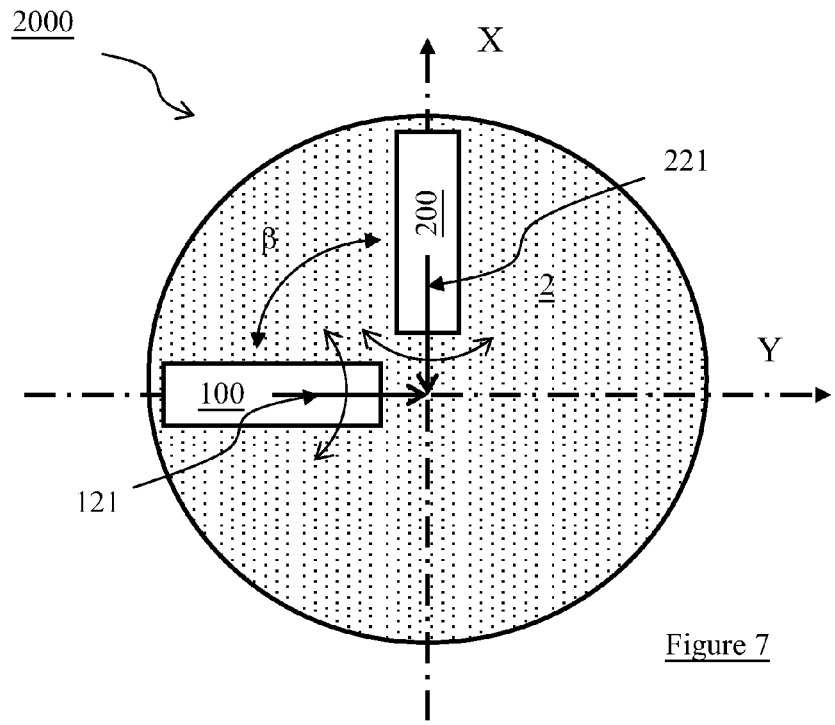
FIG. 7 is a schematic illustration of another configuration of the dual-beam apparatus for inspecting particles on a sample surface in accordance with another embodiment of the present invention.
Figure 8:
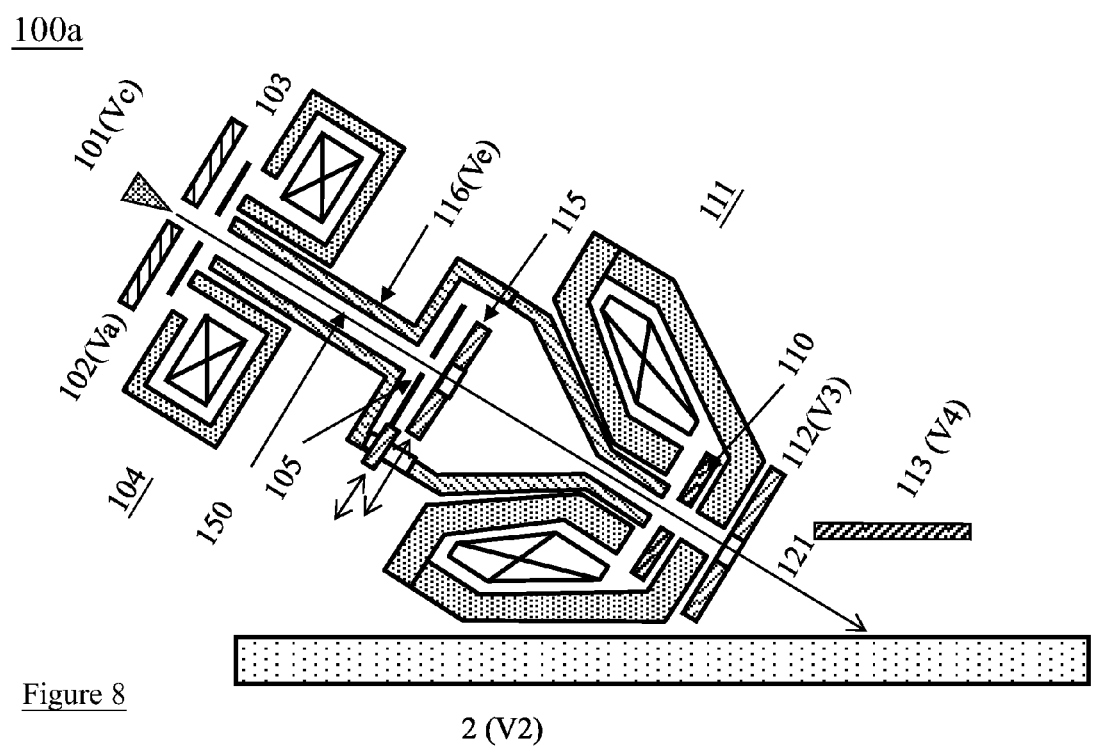
FIG. 8 is a schematic illustration of one single-beam dark-field unit which can be used in the dual-beam apparatus shown in FIGS. 4A-4C and 7.

For the embodiment 1000, the being-inspected area 2-A1 is respectively inspected in two orientations and a translation is necessary. Hence, the inspection throughput will be substantially increased if the translation can be eliminated and furthermore the inspections in two orientations can be done synchronously. Accordingly, another embodiment 2000 of the dual-beam apparatus is proposed and shown in FIG. 7. Similar to the embodiment 1000, the optical axes of two single-beam dark-field units 100 and 200 in the embodiment 2000 are respectively located inside YOZ plane and XOZ plane to form the 90° parallax therebetween and incidence angles $\alpha\_100$ and $\alpha\_200$ on the XOY plane where a being-inspected surface of the sample 2 is located. Different from the embodiment 1000, on the XOY plane (the observing plane) of the embodiment 2000, the translation D1 formed by the optical axes of two single-beam dark-field units 100 and 200 is very small, even close to zero. Each of two single-beam dark-field units 100 and 200 can have any embodiments disclosed in the cross reference, and one embodiment 100a is shown in FIG. 8. In FIG. 8, the SE-attraction electrode 113 is set parallel to the sample 2 so that it can attract SEs due to both the PE beam 121 and the PE beam 221.

In the embodiment 2000, two single-beam dark-field units 100 and 200 work in a correlated way, wherein when one of the two single-beam dark-field units 100 and 200 scans the sample 2, the other blanks out the PE beam thereof. The alternately-inspecting way is one example of the correlated way, wherein one of the single-beam dark-field units 100 and 200 inspects the sample 2 while the other blanks out its PE beam. The single-beam dark-field units 100 and 200 can employ the foregoing scanning-while-at-rest method or the scanning-while-moving method to perform the inspections. The inspection in one of the two orientations can immediately be followed by the inspection in the other of the two orientations with a very short or even no time delay for relocating the sample 2, and consequently the inspection throughput can be increased to a certain degree.

Figure 9A:
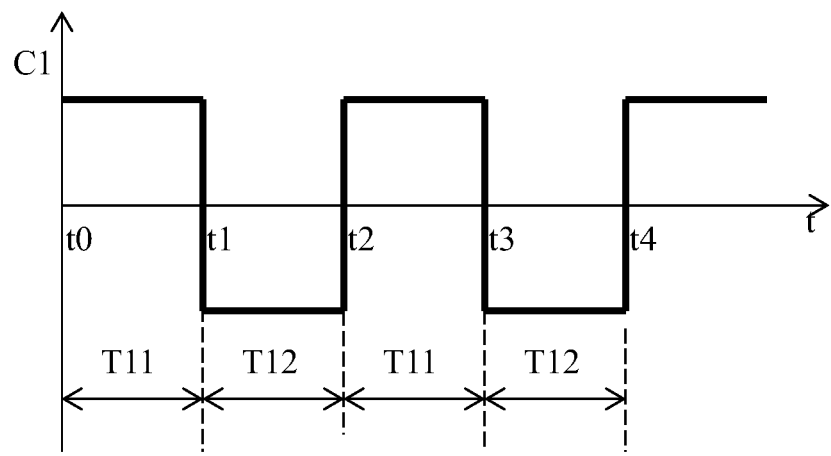
FIGS. 9A and 9B are schematic illustrations of the alternately-scanning way of the dual-beam apparatus shown in FIG. 7 in accordance with another embodiment of the present invention.
Figure 9B:
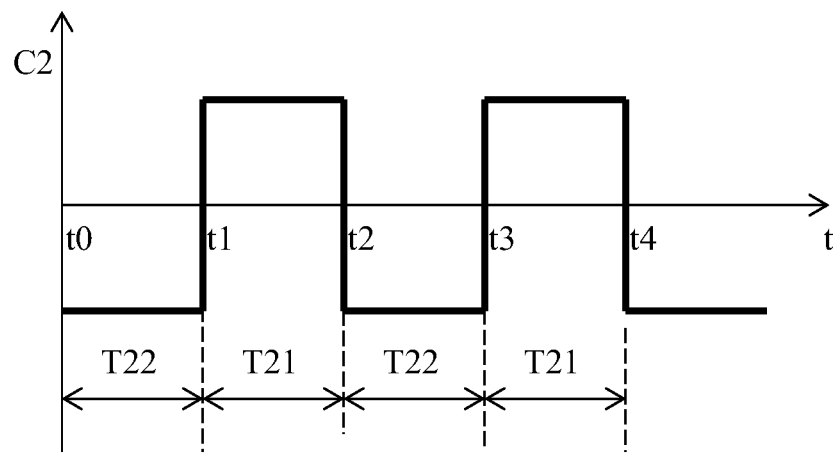

The alternately-scanning way is another example of the correlated way, wherein the single-beam dark-field units 100 and 200 work synchronously; i.e. their control clock signals for scanning imaging are synchronized with a phase difference. For each of the single-beam dark-field units 100 and 200, the control clock signal comprises multiple line-scanning period and beam-retracing period alternately distributing. During one line-scanning period of one unit, the unit performs PE beam scanning; i.e. the PE beam linearly scans the sample 2 to obtain one line of a scanning image thereof, and during one beam-retracing period of the unit, the unit performs PE beam retracing; i.e. the PE beam goes to the place corresponding to the starting point of the next line of the scanning image. FIGS. 9A and 9B show an example of the control clock signals C1 and C2 of the single-beam dark-field units 100 and 200 respectively and the synchronous relationship thereof. The time interval between the time t0 and the time t1 corresponds to a line-scanning period T11 of the single-beam dark-field unit 100 and a beam-retracing period T22 of the single-beam dark-field 200 respectively, while the time interval between the time t1 and the time t2 corresponds to a beam-retracing period T12 of the single-beam dark-field unit 100 and a line-scanning period T21 of the single-beam dark-field 200 respectively. The single-beam dark-field units 100 and 200 additionally perform PE beam blanking during each beam-retracing period T12 and each beam-retracing period T22 respectively. Consequently, two single-beam dark-field units 100 and 200 perform the scanning imaging of a being-inspected area on the sample 2 within multiple line-scanning periods and beam-retracing periods respectively, a line-scanning period in one unit corresponds to a beam-retracing period in the other unit, and each unit performs PE beam scanning during one beam-scanning period thereof and both PE beam retracing and PE beam blanking during one beam-retracing period thereof.

Figure 10A:
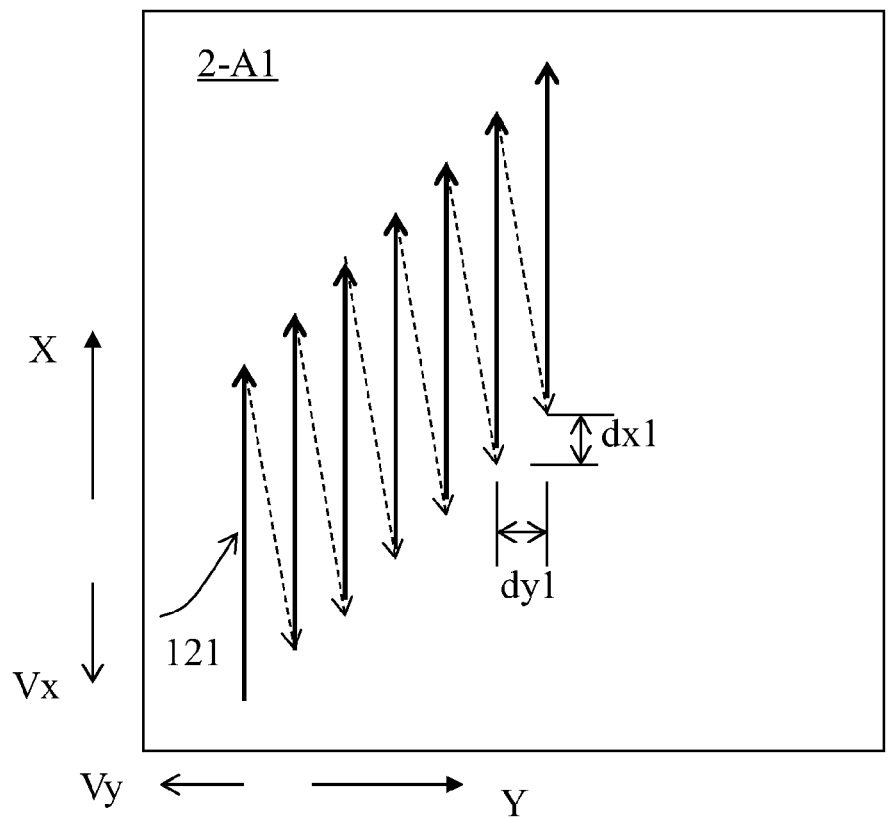
FIGS. 10A and 10B are schematic illustrations of a scanning pattern of the dual-beam apparatus shown in FIG. 7 by using the alternately-scanning way as shown in FIGS. 9A and 9B.
Figure 10B:
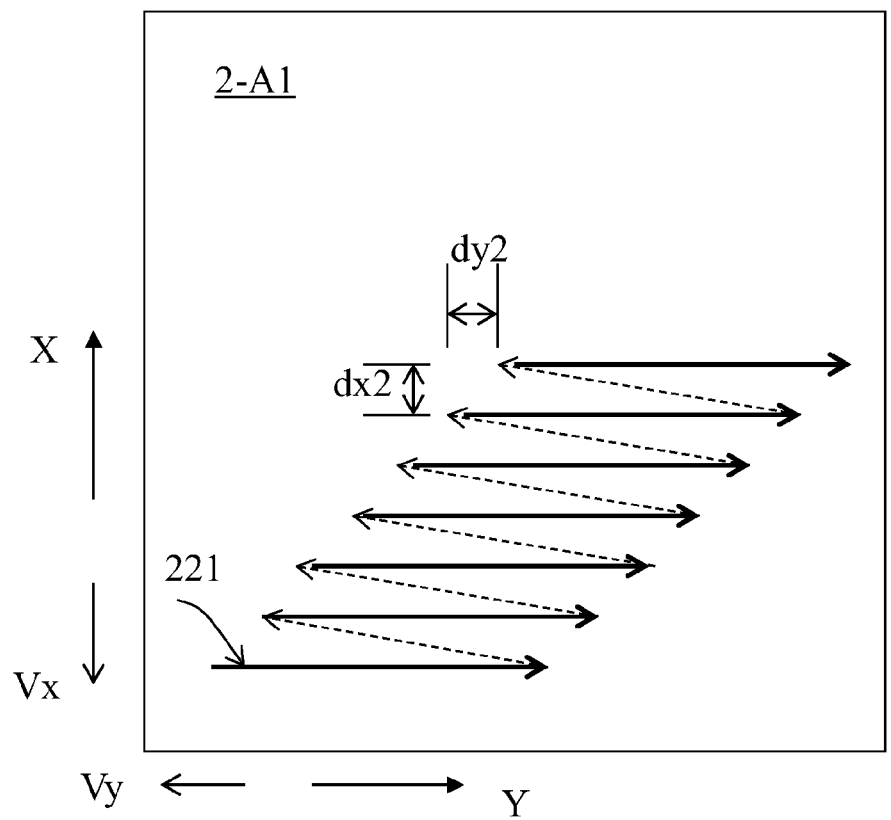

Working in the alternately-scanning way, both of the single-beam dark-field units 100 and 200 can also employ the foregoing scanning-while-at-rest method and the scanning-while-moving method to scan the sample 2. One example of the latter is shown in FIGS. 10A and 10B, wherein the sample 2 is moving with speeds Vx and Vy in the −X and −Y directions respectively while the single-beam dark-field units 100 and 200 synchronously scan the being-inspected area 2-A1. In FIG. 10A, the single-beam dark-field unit 100 scans the PE beam 121 over the being-inspected area 2-A1 with scanning speed V1x and V1y in the X and −Y directions respectively during each line-scanning period T11. The scanning speed V1x is much higher than the speed V1y which is equal to Vy. During each beam-retracing period T12, if the PE beam is retraced with a retracing speed which can not follow the sample movement in the −X direction, a line shift dx will appear in the X direction. In FIG. 10B, the single-beam dark-field unit 200 scans the PE beam 221 over the being-inspected area 2-A1 with scanning speed V2x and V2y in the −X and Y directions respectively during each line-scanning period T21. The scanning speed V2y is much higher than the speed V2x which is equal to Vx. During each beam-retracing period T22, if the PE beam is retraced with a retracing speed which can not follow the sample movement in the −Y direction, a line shift dy will appear in the Y direction. For each of the single-beam dark-field units 100 and 200, the higher scanning speed and the scanning direction thereof are called as fast scanning speed and fast scanning direction, and the lower scanning speed and the scanning direction thereof are called as slow scanning speed and slow scanning direction.

Figure 11A:
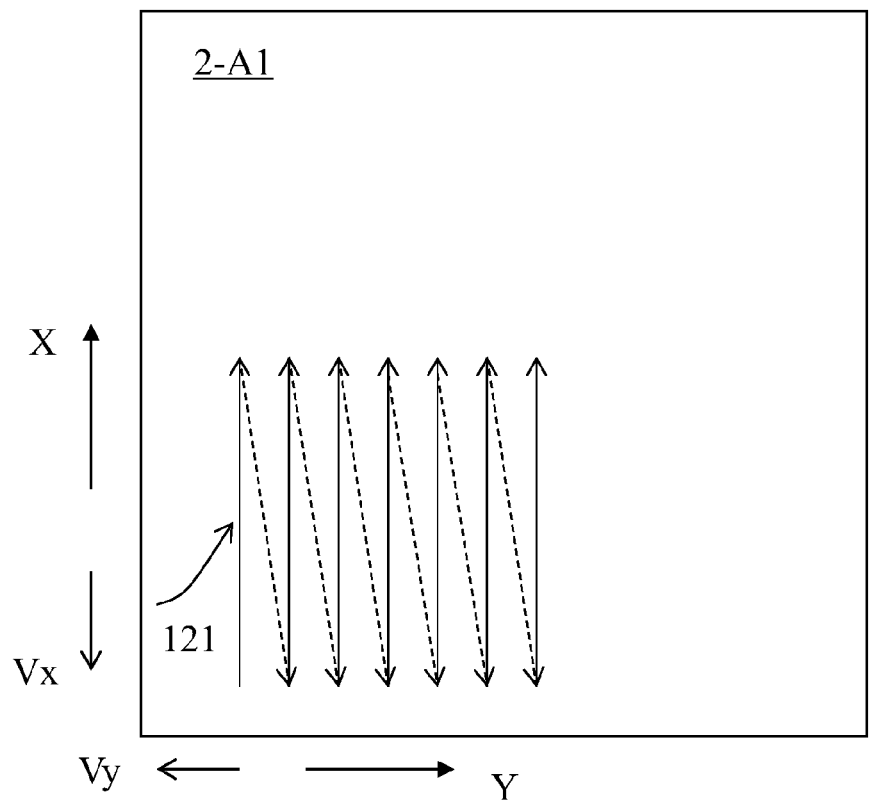
FIGS. 11A and 11B are schematic illustrations of another scanning pattern of the dual-beam apparatus shown in FIG. 7 by using the alternately-scanning way as shown in FIGS. 9A and 9B.
Figure 11B:
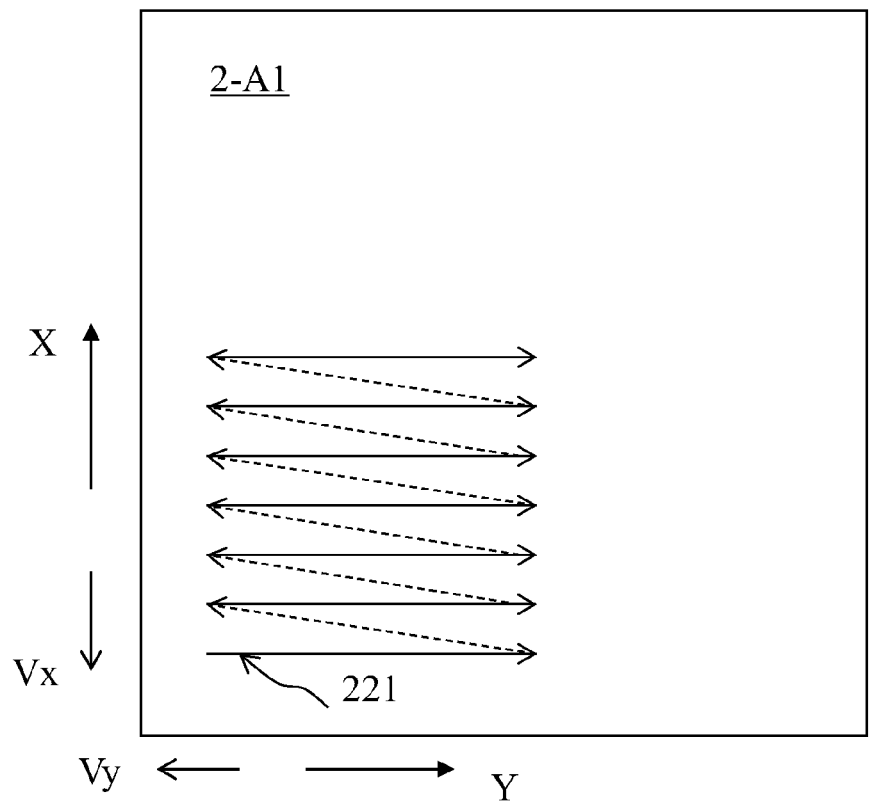

For image analysis, it is preferred to eliminate dx1 in FIG. 10A and dy2 in FIG. 10B and further make dy1 in FIG. 10A equal to dx2 in FIG. 10B, as shown in FIGS. 11A and 11B. For the single-beam dark-field unit 100, the dx1 can be eliminated if one line-scanning period T11 is equal to the next beam-retracing period T12 and the beam-retracing speed in the −X direction is equal to the sum of the fast scanning speed V1x and the double of the moving speed Vx of the sample 2. For the single-beam dark-field unit 200, the dy2 can be eliminated if one line-scanning period T21 is equal to the next beam-retracing period T22 and the beam-retracing speed in the −Y direction is equal to the sum of the fast scanning speed V2y and the double of the moving speed Vy of the sample 2. Furthermore, the dy1 can become equal to dx2 if the moving speeds Vx and Vy of the sample 2 are equal and the single-beam dark-field units 100 and 200 have equal beam-retracing speeds in the Y and X directions respectively.

For the yield management in semiconductor manufacturing, some interested inspection results from an e-beam inspection tool will be fed to an e-beam review tool for analyzing the root cause reasons of uninvited particle appearance. The e-beam review tool is required to provide imaging resolution much higher than the e-beam inspection tool. Due to the geometric aberrations and electron interactions (Coulomb effect), it is very difficult or even impossible to realize both the inspection and the review by the same single-beam unit. The state-of-art is that the inspection and the review are performed in different e-beam tools with different single-beam units. Consequently, to monitor the quality of a wafer or a mask, the wafer or the mask has to be transferred between an inspection tool and a review tool many times. The multiple transfers reduce the monitoring speed and increase the monitoring cost.

Figure 12A:
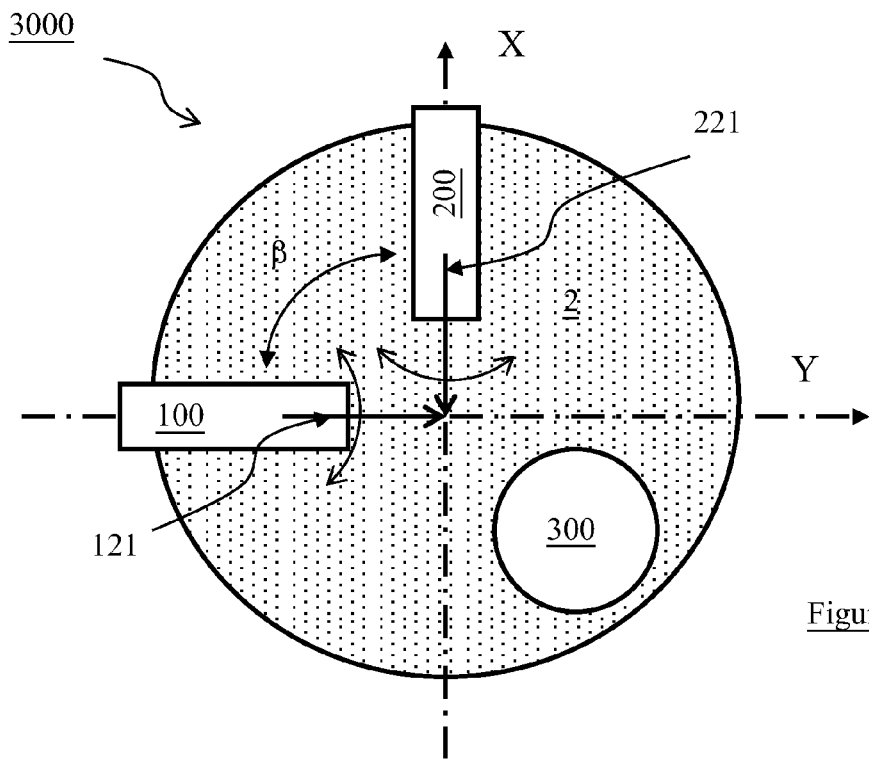
FIGS. 12A~12C are schematic illustrations of a configuration of a triple-beam apparatus for inspecting and observing particles on a sample surface in accordance with another embodiment of the present invention.
Figure 12B:
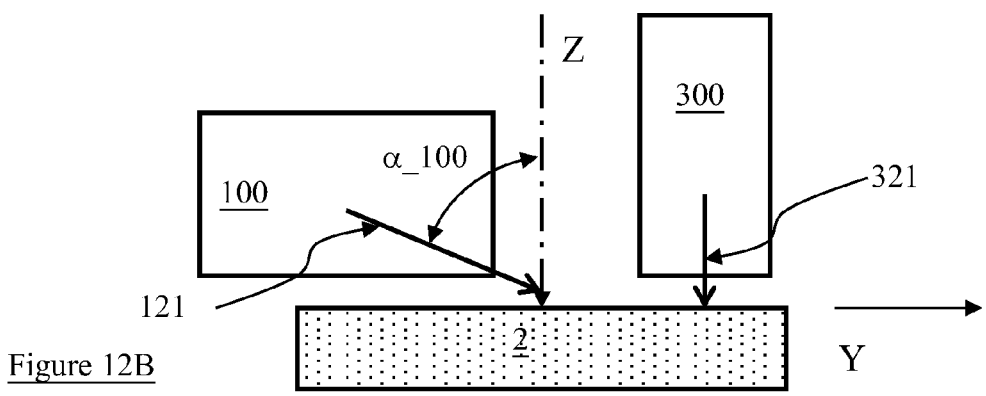
Figure 12C:
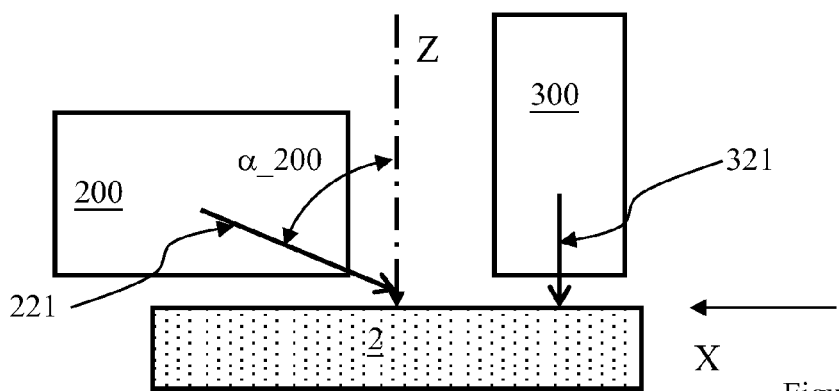

Accordingly, based on the dual-beam apparatus, this invention proposes a triple-beam apparatus performing both particle inspection and particle review. The triple-beam apparatus comprises one foregoing dual-beam apparatus taken as a particle inspection tool and one high-resolution SEM taken as a particle review tool. In this way, the transfers between the inspection tool and the review tool will be within a common vacuum chamber and limited distance ranges. Many procedures of moving and protecting wafers/masks for the transfers will be removed. One embodiment 3000 of the triple-beam is proposed and shown in FIGS. 12A~12C. The single-beam dark-field units 100 and 200 form a dual-beam apparatus same as the embodiment 2000. The optical axes of the two single-beam dark-field units 100 and 200 are respectively located inside YOZ plane and XOZ plane to form the 90° parallax therebetween and incidence angles $\alpha\_100$ and $\alpha\_200$ on the XOY plane (the observing plane) where a being-inspected surface of the sample 2 is located. The translation D1 formed by the optical axes of the two single-beam dark-field units 100 and 200 is very small, even close to zero. The single-beam unit 300 forms a high-resolution SEM with the normal incidence on the XOY plane, and is kept a large enough distance from two single-beam dark-field units 100 and 200 so as to avoid the influence therefrom.

In summary, based on the dark-field e-beam inspection method proposed by Chen et al. in the cross reference, this invention at first proposes a dual-beam apparatus for inspecting particles on a patterned sample surface with high throughput. The dual-beam apparatus comprises two single-beam dark-field units so as to provide the particle inspection in two different orientations. The two single-beam dark-field units can perform the inspections separately or almost simultaneously by means of the alternately-scanning way. The alternately-scanning way can increase the inspection throughput to a large degree. Each of the two single-beam dark-field units can obtain the images of the sample by the scanning-while-at-rest method or the scanning-while-moving method. Next, this invention proposes a triple-beam apparatus for both inspecting and reviewing particles on a patterned sample surface within the same vacuum chamber. The triple-beam apparatus comprises one foregoing dual-beam apparatus performing the particle inspection and one high-resolution SEM performing the particle review. Because the particle inspection and the particle review are performed within the common vacuum chamber, no conventional procedures for transferring the sample between a particle inspection tool and a particle review tool are necessary. Consequently, this invention will especially benefit the yield management in semiconductor manufacturing.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended

What is claimed is:

1. A method for inspecting a patterned surface of a sample, comprising:
   providing two single-beam units and each of which comprises:
      a primary electron beam (PE beam), which obliquely illuminates and scans said patterned surface and thereby generating backscattered electrons and secondary electrons therefrom;
      a detector with a through hole for said PE beam passing through, which detects said backscattered electrons traveling towards an incidence side of said PE beam; and
      an electrode close to said patterned surface, which attracts said secondary electrons from hitting said detector so that said detector provides a dark-field BSE image of said patterned surface;
   orientating said PE beams of said two single-beam units in two different directions; and
   using said two single-beam units to generate dark-field BSE images of said patterned surface.

2. The method according to claim 1, wherein said PE beams of said two single-beam units are substantially perpendicular to each other.

3. A multi-beam apparatus for observing a patterned surface of a sample, comprising:
   a sample stage supporting said sample, wherein said patterned surface is placed upwards and coincides with an observing plane;
   a first single-beam unit above said observing plane to inspect said patterned surface; and
   a second single-beam unit above said observing plane to inspect said patterned surface,
   wherein each of said first and second single-beam units comprises:
      an electron source emitting inspection primary electrons along an optical axis of said single-beam unit and said inspection primary electrons form an inspection primary electron beam (PE beam) thereof;
      a gun aperture plate below said electron source and having at least one upper opening, wherein one of the upper openings of said gun aperture plate is aligned with said optical axis and limits a current of said inspection PE beam to a first current value;
      a condenser lens below said gun aperture plate and aligned with said optical axis;
      a beam-limit aperture plate below said condenser lens and having at least one lower opening, wherein one of the lower openings of said beam-limit aperture plate is aligned with said optical axis and limits said current of said inspection PE beam to a second current value;
      a magnetic objective lens below said beam-limit aperture plate and aligned with said optical axis;
      a scanning deflection device inside a bore of said magnetic objective lens;

an electron detector below said magnetic objective lens and having a through hole, wherein said through hole is aligned with said optical axis so that said inspection PE beam can pass through; and an attraction electrode beside said electron detector and above said observing plane, wherein an incidence angle formed between said optical axis and a normal of said observing plane is larger than 0°, wherein said condenser lens and said magnetic objective lens together focus said inspection PE beam onto said patterned surface, wherein an electron detection area of said electron detector aslant faces said observing plane so as to be able to collect backscattered electrons which are generated from said patterned surface by said inspection PE beam and travel towards an incidence side thereof (called as Dark-field BSEs), wherein said attraction electrode attracts secondary electrons generated from said patterned surface by said inspection PE beam (called as SEs) to prevent said SEs from hitting said electron detection area of said electron detector, wherein said scanning deflection device deflects said inspection PE beam so as to scan said patterned surface, thereby obtaining a dark-field BSE image thereof by said electron detector;

wherein said optical axes of said first and second single-beam units are orientated in two different directions.

4. The multi-beam apparatus according to claim 3, wherein said optical axes of said first and second single-beam units are substantially perpendicular to each other.

5. The multi-beam apparatus according to claim 4, wherein a distance between intersections formed by said optical axes of said first and second single-beam units on said observing plane is so large that said first and second single-beam units can work independently.

6. The multi-beam apparatus according to claim 5, wherein each of said first and second single-beam units scans said inspection PE beam thereof over said patterned surface in two directions perpendicular to each other while said sample is remaining at rest.

7. The multi-beam apparatus according to claim 5, wherein each of said first and second single-beam units scans said inspection PE beam thereof over said patterned surface in a first direction while said sample is moving in a second direction substantially perpendicular to said first direction.

8. The multi-beam apparatus according to claim 4, wherein intersections formed by said optical axes of said two single-beam units on said observing plane are close to each other.

9. The multi-beam apparatus according to claim 8, wherein for said first and second single-beam units, one scans said inspection PE beam thereof over one interested inspection area of said patterned surface while the other blanks out said inspection PE beam thereof.

10. The multi-beam apparatus according to claim 9, wherein said first and second single-beam units obtain dark-field BSE images of said interested inspection area one after the other.

11. The multi-beam apparatus according to claim 10, wherein each of said first and second single-beam units scans said interested inspection area in two directions perpendicular to each other while said sample is remaining at rest.

12. The multi-beam apparatus according to claim 10, wherein each of said first and second single-beam units scans said interested inspection area in a first direction while said sample is moving in a second direction substantially perpendicular to said first direction.

13. The multi-beam apparatus according to claim 9, wherein said first and second single-beam units work synchronously.

14. The multi-beam apparatus according to claim 13, wherein each of said first and second single-beam units has a control clock signal for scanning imaging, which comprises multiple line-scanning periods and beam-retracing periods alternately distributing, wherein for each of said first and second single-beam units, during one line-scanning period, said inspection PE beam linearly scans said interested inspection area to obtain one line of a scanning image thereof, and during one beam-retracing period, said inspection PE beam goes to a place corresponding to a starting point of a line of said scanning image.

15. The multi-beam apparatus according to claim 14, wherein said control clock signals of said first and second single-beam units are synchronized with a phase difference.

16. The multi-beam apparatus according to claim 15, wherein a line-scanning period in one of said first and second single-beam units corresponds to a beam-retracing period in the other of said first and second single-beam units, and each of said first and second single-beam units blanks out said inspection PE beam thereof during said beam-retracing period thereof.

17. The multi-beam apparatus according to claim 16, wherein each of said first and second single-beam units scans said interested inspection area in two directions perpendicular to each other while said sample is remaining at rest.

18. The multi-beam apparatus according to claim 16, wherein said first and second units scan said inspection PE beams thereof over said interested inspection area in a first direction and a second direction respectively, while said sample moves in a direction different from said first and second directions.

19. The multi-beam apparatus according to claim 8, wherein said attraction electrodes of said first and second single-beam units are combined into one electrode.

20. The multi-beam apparatus according to claim 3, further comprising a third single-beam unit to review said patterned surface, which comprises:

a third electron source emitting review primary electrons along a third optical axis, wherein said third optical axis is an optical axis of said third single-beam unit and said review primary electrons form a review primary electron beam (PE beam) thereof;

a third gun aperture plate below said third electron source and having at least a third upper opening, wherein one of the third upper openings of said third gun aperture plate is aligned with said third optical axis and limits a current of said review PE beam to a third current value;

a third condenser lens below said third gun aperture plate and aligned with said third optical axis;

a third beam-limit aperture plate below said third condenser lens and having at least a third lower opening, wherein one of the third lower openings of said third beam-limit aperture plate is aligned with said third optical axis and limits said current of said review PE beam to a fourth current value;

a third magnetic objective lens below said third beam-limit aperture plate and aligned with said third optical axis;

a third scanning deflection device inside a third bore of said third magnetic objective lens; and a third electron detector between said third beam-limit aperture plate and said third magnetic objective lens, which has a third through hole aligned with said third optical axis for said review PE beam passing through;

wherein said third optical axis is substantially perpendicular to said observing plane, wherein said third condenser lens and said third magnetic objective lens together focus said review PE beam onto said patterned surface, wherein an electron detection area of said third electron detector faces said observing plane so as to be able to collect secondary electrons and/or backscattered electrons generated from said patterned surface by said review PE beam and traveling upwards, wherein said third scanning deflection device deflects said review PE beam so as to scan said patterned surface, thereby obtaining a secondary electron (SE) and/or BSE image thereof by said third electron detector.

21. The multi-beam apparatus according to claim 20, wherein said optical axes of said first and second single-beam units are substantially perpendicular to each other.

22. The multi-beam apparatus according to claim 21, wherein intersections formed by said optical axes of said first and second single-beam units on said observing plane are close to each other.

23. The multi-beam apparatus according to claim 22, wherein said attraction electrodes of said first and second single-beam units are combined into one electrode.

\* \* \* \* \*